United States Patent
Powell et al.

(10) Patent No.: US 7,422,634 B2
(45) Date of Patent: Sep. 9, 2008

(54) THREE INCH SILICON CARBIDE WAFER WITH LOW WARP, BOW, AND TTV

(75) Inventors: Adrian Powell, Cary, NC (US); William H. Brixius, Hillsborough, NC (US); Robert Tyler Leonard, Raleigh, NC (US); Davis Andrew McClure, Cary, NC (US); Michael Laughner, Clayton, NC (US)

(73) Assignee: Cree, Inc., Durham, NC (US)

( * ) Notice: Subject to any disclaimer, the term of this patent is extended or adjusted under 35 U.S.C. 154(b) by 476 days.

(21) Appl. No.: 11/101,110

(22) Filed: Apr. 7, 2005

(65) Prior Publication Data

US 2006/0225645 A1 Oct. 12, 2006

(51) Int. Cl.
*C01B 33/20* (2006.01)
*C30B 23/00* (2006.01)

(52) U.S. Cl. .............. 117/200; 117/201; 117/205; 257/49; 257/66; 257/E21.32; 257/E21.321; 257/E21.221; 428/64.1; 428/698

(58) Field of Classification Search ............... 117/200, 117/205; 257/49, 66; 428/698
See application file for complete search history.

(56) References Cited

U.S. PATENT DOCUMENTS

| | | | |
|---|---|---|---|
| 2,938,136 A | 5/1960 | Fischer | |
| 4,865,685 A | 9/1989 | Palmour | |
| 4,866,005 A | 9/1989 | Davis et al. | |
| 5,006,914 A | 4/1991 | Beetz, Jr. | |
| 5,030,583 A | 7/1991 | Beetz, Jr. | |
| 5,096,854 A * | 3/1992 | Saito et al. | 438/406 |
| 5,119,540 A | 6/1992 | Kong et al. | |
| 5,151,384 A | 9/1992 | Williams | |
| 5,199,055 A | 3/1993 | Noguchi et al. | |
| 5,210,051 A | 5/1993 | Carter, Jr. | |
| 5,311,055 A | 5/1994 | Goodman et al. | |
| 5,373,171 A | 12/1994 | Imai et al. | |
| 5,382,822 A | 1/1995 | Stein | |
| RE34,861 E | 2/1995 | Davis et al. | |
| 5,393,993 A | 2/1995 | Edmond et al. | |
| 5,422,901 A | 6/1995 | Lebby et al. | |
| 5,523,589 A | 6/1996 | Edmond et al. | |
| 5,611,955 A | 3/1997 | Barrett et al. | |

(Continued)

FOREIGN PATENT DOCUMENTS

EP 0 561 462 A2 9/1993

(Continued)

OTHER PUBLICATIONS

T. Furusho, S.K. Lilov, Ohshima, S. Nishino; Crystal growth of silicon carbide in hydrogen atmosphere by sublimation close space technique;Journal of Crystal Growth 237-239 (2002) 1235-1238 Elsevier Science B.V. Japan.

(Continued)

*Primary Examiner*—Dao H Nguyen
(74) *Attorney, Agent, or Firm*—Summa, Allan & Addition, P.A.

(57) ABSTRACT

A high quality single crystal wafer of SiC is disclosed. The wafer has a diameter of at least about 3 inches, a warp of less than about 5 μm, a bow less than about 5 μm, and a total thickness variation of less than about 2.0 μm.

17 Claims, 3 Drawing Sheets

U.S. PATENT DOCUMENTS

| | | | |
|---|---|---|---|
| 5,661,312 A | 8/1997 | Weitzel et al. | |
| 5,667,586 A | 9/1997 | Ek et al. | |
| 5,709,745 A | 1/1998 | Larkin et al. | |
| 5,718,760 A | 2/1998 | Carter et al. | |
| 5,872,415 A | 2/1999 | Dreifus et al. | |
| 6,017,779 A * | 1/2000 | Miyasaka | 438/149 |
| 6,025,289 A | 2/2000 | Carter, Jr. et al. | |
| 6,113,451 A | 9/2000 | Hobart et al. | |
| 6,150,239 A | 11/2000 | Goesele et al. | |
| 6,156,581 A | 12/2000 | Vaudo et al. | |
| 6,193,585 B1 * | 2/2001 | Tanabe et al. | 451/41 |
| 6,196,901 B1 | 3/2001 | Minami | |
| 6,200,917 B1 | 3/2001 | Carter et al. | |
| 6,201,342 B1 | 3/2001 | Hobart et al. | |
| 6,218,680 B1 | 4/2001 | Carter, Jr. et al. | |
| 6,316,793 B1 | 11/2001 | Sheppard et al. | |
| 6,316,826 B1 | 11/2001 | Yamamoto et al. | |
| 6,396,080 B2 | 5/2002 | Carter, Jr. et al. | |
| 6,396,864 B1 | 5/2002 | O'Brien et al. | |
| 6,403,982 B2 | 6/2002 | Carter, Jr. et al. | |
| 6,497,763 B2 | 12/2002 | Kub et al. | |
| 6,497,764 B2 | 12/2002 | Kuhn et al. | |
| 6,507,046 B2 | 1/2003 | Mueller | |
| 6,533,874 B1 | 3/2003 | Vaudo et al. | |
| 6,548,333 B2 | 4/2003 | Smith | |
| 6,568,384 B1 | 5/2003 | Onizaki | |
| 6,583,454 B2 | 6/2003 | Sheppard et al. | |
| 6,586,781 B2 | 7/2003 | Wu et al. | |
| 6,599,815 B1 | 7/2003 | Yang | |
| 6,634,770 B2 | 10/2003 | Cao | |
| 6,639,247 B2 | 10/2003 | Carter, Jr. et al. | |
| 6,670,693 B1 | 12/2003 | Quick | |
| 6,686,676 B2 | 2/2004 | McNulty et al. | |
| 6,692,568 B2 | 2/2004 | Cuomo et al. | |
| 6,706,114 B2 | 3/2004 | Mueller | |
| 6,757,314 B2 | 6/2004 | Kneissl et al. | |
| 6,814,801 B2 | 11/2004 | Jenny et al. | |
| 6,849,874 B2 | 2/2005 | Sumakeris et al. | |
| 7,025,665 B2 * | 4/2006 | Bender | 451/296 |
| 2001/0017374 A1 | 8/2001 | Tsvetkov | |
| 2001/0027082 A1 * | 10/2001 | Vepa et al. | 451/41 |
| 2002/0078881 A1 | 6/2002 | Cuomo et al. | |
| 2002/0086534 A1 | 7/2002 | Cuomo et al. | |
| 2002/0096104 A1 | 7/2002 | Yagi et al. | |
| 2002/0117695 A1 | 8/2002 | Borges et al. | |
| 2002/0123204 A1 | 9/2002 | Torvik | |
| 2002/0167023 A1 | 11/2002 | Chavarkar et al. | |
| 2002/0180351 A1 | 12/2002 | McNulty et al. | |
| 2002/0182779 A1 | 12/2002 | Bewley et al. | |
| 2003/0096507 A1 | 5/2003 | Baker et al. | |
| 2003/0102482 A1 | 6/2003 | Saxler | |
| 2003/0107045 A1 | 6/2003 | Eisert et al. | |
| 2003/0127654 A1 | 7/2003 | Eisert et al. | |
| 2003/0219959 A1 | 11/2003 | Ghyselen et al. | |
| 2003/0233975 A1 | 12/2003 | Jenny et al. | |
| 2004/0023468 A1 | 2/2004 | Ghyselen et al. | |
| 2004/0051141 A1 | 3/2004 | Udrea | |
| 2004/0134418 A1 | 7/2004 | Hirooka | |
| 2004/0201024 A1 | 10/2004 | Tsvetkov et al. | |
| 2004/0206298 A1 | 10/2004 | Jenny et al. | |
| 2005/0022724 A1 | 2/2005 | Malta et al. | |
| 2005/0022727 A1 | 2/2005 | Fechko et al. | |

FOREIGN PATENT DOCUMENTS

| | | |
|---|---|---|
| GB | 772 691 A | 4/1957 |
| JP | 3295267 | 12/1991 |
| JP | 2002265296 | 9/2002 |
| JP | 2003037074 | 2/2003 |
| WO | WO 90/00717 A1 | 1/1990 |
| WO | WO 97/28297 A1 | 8/1997 |

OTHER PUBLICATIONS

I.G.Ivanov, C Hallin, A.Henry, O.Kordina, E.Janzen; Nitrogen doping concentration as determined by photoluminescence in 4H-and 6H-SiC; J. Appl. Phys. Sep. 15, 1996 3504-3508.

J.R. Jenny, St. G. Muller, A.Powell, V.F. Tsvetkov, H.McD.Hobgood, R.C. Glass, & C.H.Carter; High Purity Semi-Insulating 4H-SiC Grown by the Seeded Sublimation Method; Preprint-2001 Electronic Materials Conference-submitted to Journal of Electronic Materials, U.S.A.

W.L. Pribble, et al., Applications of SiC MESFETs and GaN HEMTs in Power Amplifier Design; 2002 IEEE MTT-S Digest, 30:1819-1822.

S. Elhamri et al., Persistent Photoconductivity in a high Mobility two Dimensional Electron Gas in and AlGaN/Gan Heterostructure; 2001 Mat. Res. Soc. Symp. Proc. vol. 639, G7.6.1-G7.6.6.

A. Saxler, et al., Electroluminescence of III-Nitride Double Heterostructure Light Emitting Diodes with Silicon and Magnesium Doped InGaN, Materials Science Forum vol. 258-263 (1997), pp. 1229-1234.

D. K. Gaskill, Summary of the Workshop on Bonded and Compliant Substrates, MRS Internet Journal, Nitride Semiconductor Research, Mar. 4, 1998, 2 pages.

G. K. Celler et al., Frontiers of silicon-on-insulator, Journal of Applied Physics, vol. 93, No. 9, May 1, 2003, p. 4955.

H. Moriceau, et al., New Layer Transfers Obtained by the SmartCut Process, Journal of Electronic Materials, vol. 32, No. 8, 2003, pp. 829-835.

Kuhr et al.; "Hexagonal Voids and the Formation of Micropipes During SiC Sublimation Growth," J. Appl.Phys., vol. 89, No. 8, 2001, pp. 4625-4630.

Powell; "Growth of Low Micropipe Density SiC Wafers" Materials Science Forum, vol. 338-340, 2000, pp. 437-440.

Mueller; "Status of SiC Bulk Growth from an Industrial Point of View", Journal of Crystal Growth, vol. 211, No. 1, 2000, pp. 325-332.

Dmitriev et al.; "Large Area Silicon Carbide Devices Fabricated on SiC Wafers with Reduced Micropipe Density", Materials Science and Engineering, vol. B61-62, 1999, pp. 446-449.

Sanchez et al.; "Formation of Thermal Decomposition Cavities in Physical Vapor Transport of Silicon Carbide", vol. 29, No. 3, 2000, pp. 347-352.

Rabeck et al.; "Thermodynamic Considerations of the Role of Hydrogen in Sublimation Growth", Journal of the Electrochemical Society, vol. 144, 1997, pp. 1024-1027.

Lilov et al.; "Studies of Growth Processes in Silicon Carbide Epitaxial Layers from the Vapour Phase", Journal of Crystal Growth, vol. 32, 1976, pp. 170-178.

Bakin et al.; "State of the Art in Defect Control of Bulk SiC", 1998 High Temperature Electronic Materials, Devices and Sensors Conference, 1998.

Vetter et al.; "Harmonic Composition of Synchrotron White-beam X-ray Topographic Back-reflection Images of Basal-cut Silicon Carbide Single-Crystal Wafers", J. Appl. Cryst., vol. 31, 1198, pp. 820-822.

Everything Wafers: A Guide to Semiconductor Substrates, www.ece.byu.edu/cleanroom/everything_wafers.phtml?everything_wafers-see-all=true.

Ellison et al: Wafer Warpage, Crystal Bending and Interface Properties of 4H-SiC epi-Wafers, Diamond and Related Materials, Elsevier Science Publishers, Amsterdam, NL, vol. 6, No. 10, Aug. 1997; pp. 1369-1373.

Nakayama et al: "The Development of 4H-Sic {03 3 8} Wafers." Materials Sicence Forum, Aedermannsfdorf, CH, vol. 389-393, 2002, pp. 123-126.

* cited by examiner

THREE INCH SILICON CARBIDE WAFER WITH LOW WARP, BOW, AND TTV

BACKGROUND OF THE INVENTION

The present invention relates to low defect silicon carbide wafers and their use as precursors for semiconductor purposes, to seeded sublimation growth of large, high-quality silicon carbide single crystals, and to high quality epitaxial growth upon such low defect wafers.

The invention is also related to the following copending and commonly assigned U.S. applications: Ser. No. 10/628,189 filed Jul. 28, 2003 for Growth of Ultra-High Purity Silicon Carbide Crystals in an Ambient Containing Hydrogen; Ser. No. 10/628,188 filed Jul. 28, 2003 for Reducing Nitrogen Content in Silicon Carbide Crystals by Sublimation Growth in a Hydrogen-Containing Ambient; Ser. No. 10/707,898 filed Jan. 22, 2004 for Silicon Carbide on Diamond Substrates and Related Devices and Methods; Ser. No. 60/522,326 filed Sep. 15, 2004 for Seed Preparation for the Growth of High Quality Large Size Silicon Carbide Crystals; Ser. No. 10/915,095 filed Aug. 10, 2004 for Seed and Seedholder Combinations for High Quality Growth of Large Silicon Carbide Single Crystals; and Ser. No. 10/876,963 filed Jun. 25, 2004 for One Hundred Millimeter High Purity Semi-Insulating Single Crystal Silicon Carbide Wafer. The contents of these applications are likewise incorporated entirely herein by reference.

Silicon carbide has found use as semiconductor material for various electronic devices and purposes in recent years. Silicon carbide is especially useful due to its physical strength and high resistance to chemical attack. Silicon carbide also has excellent electronic properties, including radiation hardness, high breakdown field, a relatively wide band gap, high saturated electron drift velocity, high-temperature operation, and absorption and emission of high-energy photons in the blue, violet, and ultraviolet regions of the spectrum.

Silicon carbide is a difficult material to work with because it can crystallize in over 150 polytypes, some of which are separated from one another by very small thermodynamic differences. Furthermore, because of silicon carbide's high melting point (over 2700° C. under high pressure), many processes for working silicon carbide, including epitaxial film deposition, often need to be carried out at much higher temperatures than analogous reactions in other semiconductor materials.

As well recognized by those of ordinary skill in the relevant arts, the electronic performance of devices made from or including a given semiconductor material depend upon the structure of the device, the physical characteristics of the material (e.g., the band gap limits the highest frequency wavelength of the light that can be produced) and also upon the quality of the crystal. Stated differently, although some electronic devices can be successfully formed in polycrystalline semiconductor materials, many more require single crystal semiconductor portions that have high crystal quality and resulting excellent performance. Stated in yet another fashion, the theoretical capabilities of a given semiconductor material, including silicon carbide, remain functionally meaningless unless and until the material can be produced in useful quality and quantities.

Single crystal silicon carbide is often produced by a seeded sublimation growth process. In a typical silicon carbide growth technique, the seed crystal and a source powder are both placed in a reaction crucible which is heated to the sublimation temperature of the source and in a manner that produces a thermal gradient between the source and the marginally cooler seed crystal. The thermal gradient encourages vapor phase movement of the materials from the source to the seed followed by condensation upon the seed and the resulting bulk crystal growth. The method is also referred to as physical vapor transport (PVT).

In a typical silicon carbide growth technique, the crucible is made of graphite and is heated by induction or resistance, with the relevant coils and insulation being placed to establish and control the desired thermal gradient. The source powder is silicon carbide, as is the seed. The crucible is oriented vertically, with the source powder in the lower portions and the seed positioned at the top, typically on the seed holder; see U.S. Pat. No. 4,866,005 (reissued as No. Re 34,861) the contents of which are incorporated entirely herein by reference. These sources are exemplary, rather than limiting, descriptions of modern seeded sublimation growth techniques.

Following bulk growth, the crystal is often cut into blocks having a predetermined shape, ground at the periphery and then set in a slicer. In the slicer, the crystal block is sliced into wafers having a predetermined thickness by a high-speed rotating blade.

Typically, a slicing blade is representatively an inner diameter saw prepared by cutting a thin stainless steel sheet to an annular shape and depositing a Ni plating layer in which diamond abrasives are embedded on an inner edge of the shaped stainless steel sheet.

A wafer obtained by slicing a crystal ingot in this manner is likely to deviate in thickness and flatness due to various conditions such as the tension applied to the slicing blade, adherence of diamond abrasives onto an inner edge of the blade, and the dimensional accuracy of a rotation axis of a slicer. If slicing conditions are not appropriate, a work damage layer which extends from the surface is deeply developed into the inner part of the sliced wafer.

This slicing operation can also be achieved through the use of wire saws, where a wire is used in place of the cutting blade. In this case the abrasives are either embedded into the wire, or contained in a slurry that is sprayed onto the wire immediately prior to the slicing operation. In this case similar thickness and flatness variations are observed.

These unfavorable deviations resulting from slicing may be reduced by lapping a sliced wafer.

With reference to FIGS. 1(a) and (b), in a conventional lapping method, a plurality of wafers 2 are set in carriers 4 and located on a lower lapping plate 6, in the manner such that the wafers 2 are uniformly distributed on the lower lapping plate 6. An upper lapping plate 8 is brought down into contact with the wafers 2, abrasives are fed into a gap between the lower lapping plate 6 and the upper lapping plate 8, and the wafers 2 are rotated and revolved. During rotation and revolution, the wafers 2 are ground with the abrasives. A commonly used slurry is prepared by suspending Diamond or Boron Nitride grains as abrasives having a particle size of approximately 10 µm in a proper amount of water or other solvent.

One drawback to traditional lapping and slicing techniques is the introduction of warp, bow, and total thickness variations (TTV) in the sliced wafers. "Warp" is defined as the difference between minimum and maximum values of the wafer surface measured from a reference plane. Deviations include both convex and concave variations. Warp is a bulk defect (i.e., a defect that affects an entire wafer, not just portions of the wafer surface). "Bow" is the concavity or deformation of the wafer as measured from the center of the wafer, independent of any thickness variation. "Total thickness variation" is defined as the absolute difference in thickness between the thickest and thinnest parts of the wafer.

Wafers with high warp, bow and TTV may be undesirable for several reasons. For example, during epitaxial growth processes, high warp, bow and TTV levels result in uneven contact between the wafer and susceptor. Such uneven contact may result in thermal variations across the seed during the epitaxial growth process. Also high warp values may increase the risk of wafer cracking during the device fadrication steps due to the stresses induced as the wafer is sucked down to the vacuum chucks.

Accordingly, producing larger high quality silicon carbide with low warp bow and TTV levels in wafers sliced from crystals formed in the seeded sublimation system remains a constant technical commercial goal.

SUMMARY

In one aspect, the present invention is a high quality single crystal wafer of SiC having a diameter of at least about 3 inches, a warp of less than about 0.5 μm, a bow less than about 0.5 μm, and a TTV of less than about 1.0 μm.

In another aspect, the invention is a SiC semiconductor precursor wafer having a diameter of at least about 3 inches, a warp of less than about 0.4 μm, a bow less than about 0.4 μm, and a TTV of less than about 0.9 μm.

In another aspect, the invention is a method of epitaxial growth of SiC or of III-V materials on high quality single crystal wafers of SiC having a diameter of at least about 3 inches, a warp of less than about 0.5 μm, a bow less than about 0.5 μm, and a TTV of less than about 1.0 μm.

In yet another aspect, the invention is a plurality of power, microwave, or LED devices built on a single crystal substrate of SiC having a diameter of at least about 3 inches, a warp of less than about 0.5 μm, a bow less than about 0.5 μm, and a TTV of less than about 1.0 μm.

DETAILED DESCRIPTION

The present invention incorporates several techniques for improving high quality silicon carbide wafers.

In one aspect, the present invention is a high quality single crystal wafer of SiC having a diameter of at least about 3 inches, a warp of less than about 0.5 μm, more preferably less than about 0.4 μm, and most preferably less than about 0.3 μm, a bow less than about 0.5 μm, more preferably less than about 0.4 μm, and most preferably less than about 0.3 μm, and a TTV less than about 2.0 μm, more preferably less than 0.9 μm, and most preferably less than about 0.8 μm. The polytype of the single crystal SiC is preferably 3C, 4H, 6H, 2H, or 15R.

In considering the proportional dimensions of the diameter and thickness of the seed crystal, whether expressed as a percentage, a fraction, or a ratio, it will be understood that in the context of the improvements provided by the invention, these proportions have their inventive meaning in the context of the larger-diameter seed crystals that are described herein.

Accordingly, in certain embodiments the invention is described and claimed herein in the relevant embodiments in a manner that includes the absolute dimensions of the crystal, usually in terms of a diameter, of which 2 inch, 3 inch, and 100 mm diameter single crystals are preferred.

In another aspect, the invention is a high quality semiconductor precursor wafer. The wafer is a silicon carbide wafer of the 4H polytype, having a diameter of at least about 3 inches, a warp of between about 0.05 μm and about 0.5 μm, a bow of between about 0.01 μm and about 0.3 μm, and a TTV between about 0.5 μm and 1.0 μm.

In another aspect, the invention is a high quality semiconductor precursor wafer. The wafer is a silicon carbide wafer of the 4H polytype, having a diameter of at least about 3 inches, and a warp of less than about 0.5 μm.

In another aspect, the invention is a high quality semiconductor precursor wafer. The wafer is a silicon carbide wafer of the 4H polytype, having a diameter of at least about 3 inches, and a bow of less than about 0.5 μm.

In another aspect, the invention is a high quality semiconductor precursor wafer. The wafer is a silicon carbide wafer of the 4H polytype, having a diameter of at least about 3 inches, and a TTV of less than about 1.0 μm.

Figure 1A:
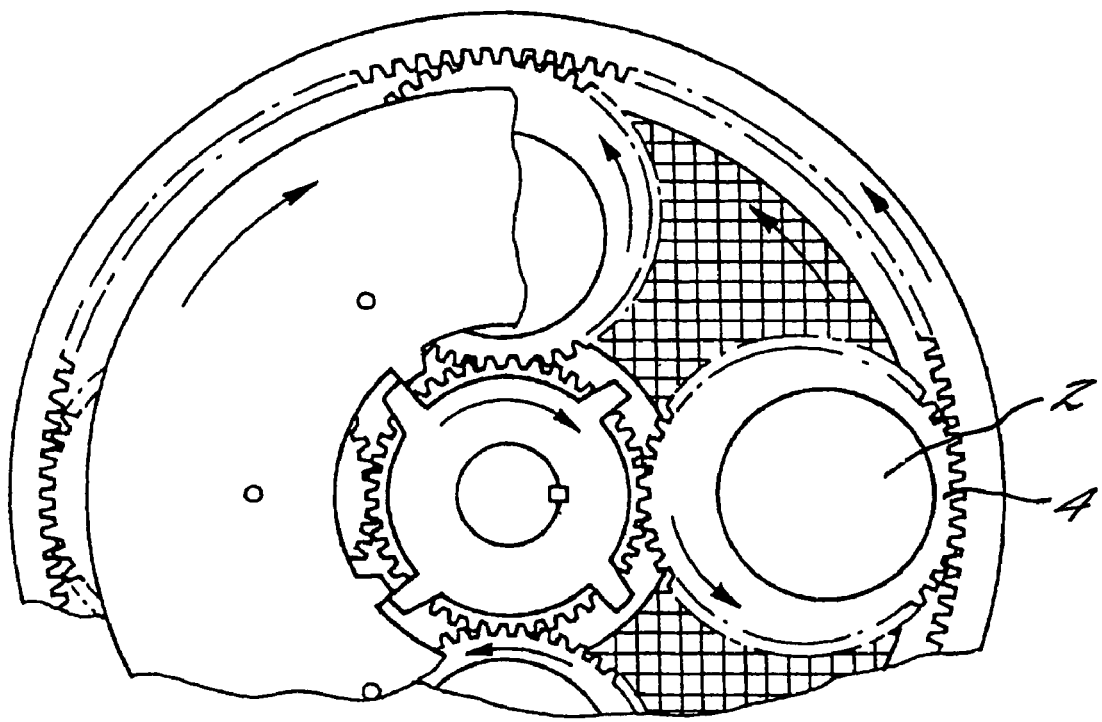
FIGS. 1(a) and 1(b) are schematic depictions of a conventional double-side lapping machine used in accordance with the present invention.
Figure 1B:
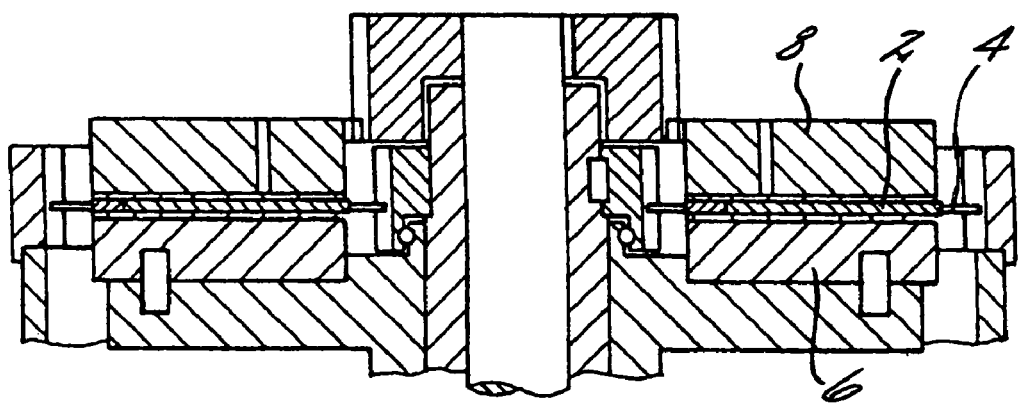
Figure 2:
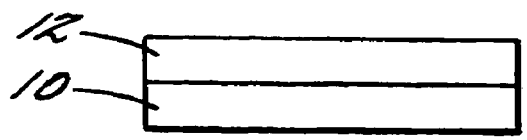
FIG. 2 is a semiconductor precursor wafer in accordance with the present invention.

In another aspect, as schematically depicted in FIG. 2, the invention is a high quality silicon carbide semiconductor precursor wafer 10 having a 4H polytype, a diameter of at least about 3 inches, a warp of less than about 0.5 μm, a bow of less than about 0.5 μm, and a TTV of less than about 1.0 μm. The wafer additionally has a Group III-nitride epitaxial layer 12 located on the surface. The Group III-nitride layer 12 is preferably one or more of GaN, AlGaN, AlN, AlInGaN, InN, and AlInN.

The growth and electronic characteristics of Group III nitrides are generally well-understood in this art. Group III nitride layers on silicon carbide substrates are a basic feature of certain types of light emitting diodes (LEDs). Among other desirable factors, the atomic fraction of the Group III element (e.g. $In_xGa_yN_{1-x-y}$) tailors the bandgap of the composition (within limits) to likewise tailor the resulting emission frequency and thus the color of the LED.

Figure 3:
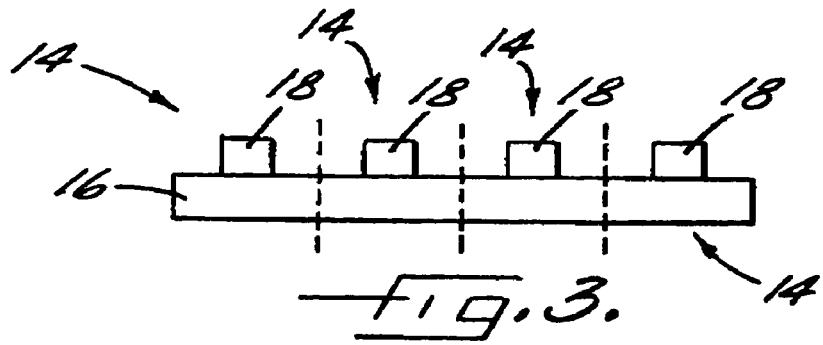
FIG. 3 is a plurality of semiconductor precursor devices in accordance with the present invention.

With respect to FIG. 3, the invention is a plurality of silicon carbide semiconductor device precursors 14 on a SiC seed 16 having a diameter of at least about 3 inches, a warp of less than about 0.5 μm, a bow of less than about 0.5 μm, and a TTV less than about 1.0 μm. The wafer additionally has a plurality of respective Group III-nitride epitaxial layers 18 on some portions of the wafer. Preferred Group III-nitride epitaxial layers are individually selected from GaN, AlGaN, AlN, AlInGaN, InN, and AlInN.

Figure 4:
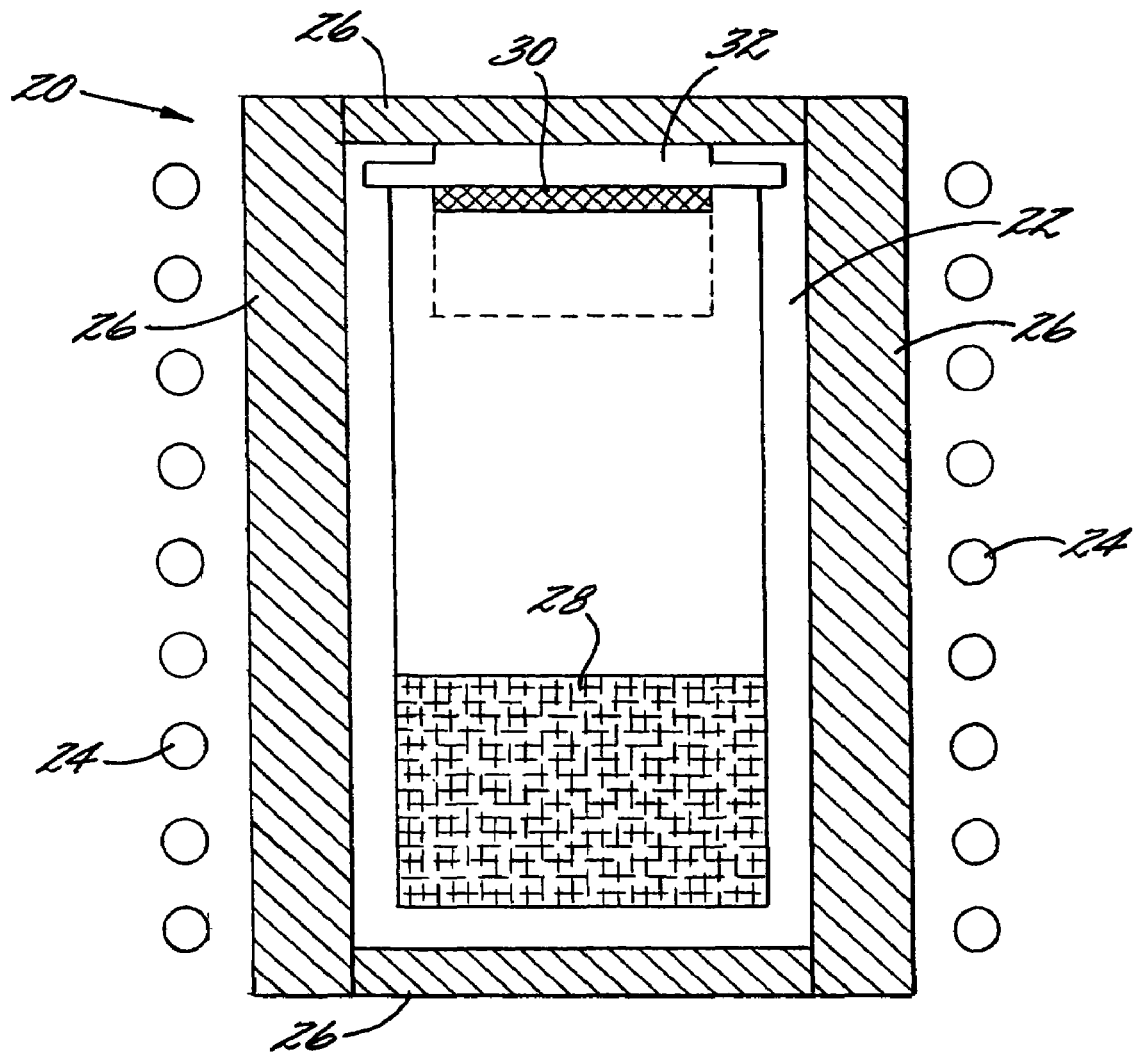
FIG. 4 is a schematic cross-sectional view of a seeded sublimation system in accordance with the present invention.

FIG. 4 is a cross sectional schematic diagram of a sublimation system for seeded sublimation growth of silicon carbide The system is broadly designated at 20. As in most typical systems, the system 20 includes a graphite susceptor 22 and a plurality of induction coils 24 that heat the susceptor 22 when current is applied through the coils 24. Alternatively, some systems incorporate resistance heating. It will be understood by those familiar with these crystal growth techniques that the system can be further enclosed in some circumstances, e.g., in a water-cooled quartz vessel. Additionally, at least one gas inlet and outlet (not shown) in communication with the susceptor 22 are included in the seeded sublimation system 20. The susceptor 22 is typically surrounded by insulation 26, several portions of which are illustrated in FIG. 4. The susceptor 22 includes one or more portions for containing a silicon carbide powder source 28. Such a powder source 28 is most commonly—although not exclusively—used in seeded sublimation growth techniques for silicon carbide. A silicon carbide seed is designated at 30, and is typically placed in upper portions of the susceptor 22. The seed 30 is preferably a monocrystalline SiC seed having a diameter of at least about 3 inches and having a warp of less than about 0.5 µm, bow of less than about 0.5 µm, and a TTV less than about 1.0 µm. A growing crystal 34 is deposited on the seed 30 during the seeded sublimation growth. A seed holder 32 typically holds the seed 30 in place with the seed holder 32 being attached to the susceptor 22 in an appropriate fashion. This can include various arrangements known to those of skill in the art.

In another aspect, the invention is a method of producing a high quality bulk single crystal of silicon carbide in a seeded sublimation system, the improvement includes growing a SiC boule having a diameter of at least about 3 inches, thereafter slicing the SiC boule, preferably mechanically, into wafers, wherein each wafer has a warp of less than about 0.5 µm, a bow of less than about 0.5 µm, and a TTV less than about 1.0 µm on the surface. The wafers are preferably about 0.5 mm thick.

In a preferred embodiment, the sliced wafer is processed such that surface and subsurface damage levels on each side are equivalent to the damage levels induced by the previously discussed lapper. On a double sided lapper, a lapping process is commenced using a down force less than that required to bend the wafer. For example, a force equal to about 200 g is likely appropriate for a 3 inch diameter, 600 µm thick wafer. The resulting wafer has an induced bow that is not due to differential damage and can be processed with standard double or single side polishing to produce a wafer with low warp, bow, and TTV.

It may be preferable to then polish and etch the SiC wafers. A preferred polish is a chemo-mechanical polish and a preferred etch is a molten KOH etch. The etch is carried out as a quality control technique in order to highlight the defects on the surface, and is unnecessary (and undesirable) as a precursor step to further SiC or III-V growth. Thus, growth is typically carried out on a polished seed that has not been etched.

As is known in the art, the SiC boule is preferably grown in a seeded sublimation system. After the boule is sliced into wafers, the wafers may then, in turn, be used as the seed in a seeded sublimation growth of a single crystal of silicon carbide.

As noted in the background portion of the specification, the general aspects of seeded sublimation growth of silicon carbide have been generally well established for a number of years. Furthermore, those familiar with the growth of crystals, particularly in difficult material systems such as silicon carbide, will recognize that the details of a given technique can and will vary, usually purposefully, depending upon the relevant circumstances. Accordingly, the descriptions given herein are most appropriately given in a general and schematic sense with the recognition that those persons of skill in this art will be able to carry out the improvements of the invention based on the disclosures herein without undue experimentation.

In describing the invention, it will be understood that a number of techniques are disclosed. Each of these has individual benefit, and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

As generally noted in the Background, the performance properties of electronic devices will typically improve as the crystal quality of the various device portions improves. Thus, the reduced-defect characteristics of wafers of the present invention similarly provide improved devices. In particular, higher power higher current devices become increasingly available as the warp, bow, and TTV drop to 5 µm or below.

Thus, in another aspect, the invention is a plurality of field-effect transistors formed on a low-defect 3 inch silicon carbide wafer having a warp less than about 0.5 µm, bow less than about 0.5 µm, and a TTV less than about 1.0 µm.

Figure 5:
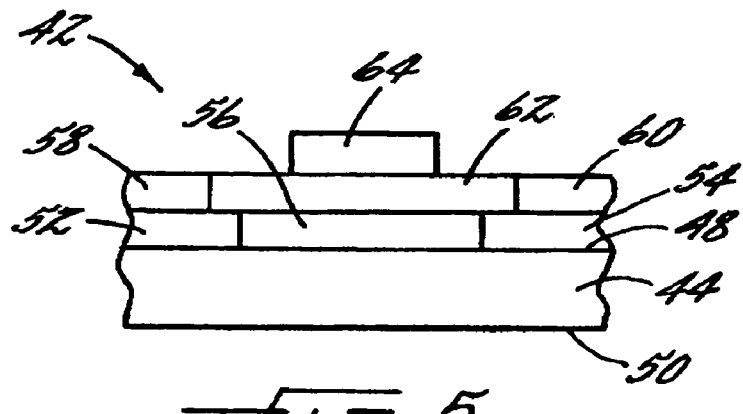
FIG. 5 is a schematic cross-sectional view of a metal oxide semiconductor field effect transistor in accordance with the present invention.

In another aspect, the invention is a plurality of metal oxide semiconductor field effect transistors (MOSFETs) 42 formed on a low defect 3 inch silicon carbide substrate 44 having a warp less than about 0.5 µm, bow less than about 0.5 µm, and a TTV less than about 1.0 µm. FIG. 5 is a schematic cross-sectional illustration of a basic MOSFET structure. The bulk single crystal substrate 44 includes a respective first surface 48 and second surface 50 opposite one another. An epitaxial layer on the substrate has respective source 52, channel 56, and drain 54 portions with the channel 56 being controlled by the gate contact 64 through the oxide layer 62. Respective source and drain contacts 58, 60 are on the source and drain portions 52, 54. The structure and operation of MOSFETs, and of combinations and variations of MOSFETs, is well understood in this art and thus FIG. 5 and its description are exemplary rather than limiting of the claimed invention.

Figure 6:
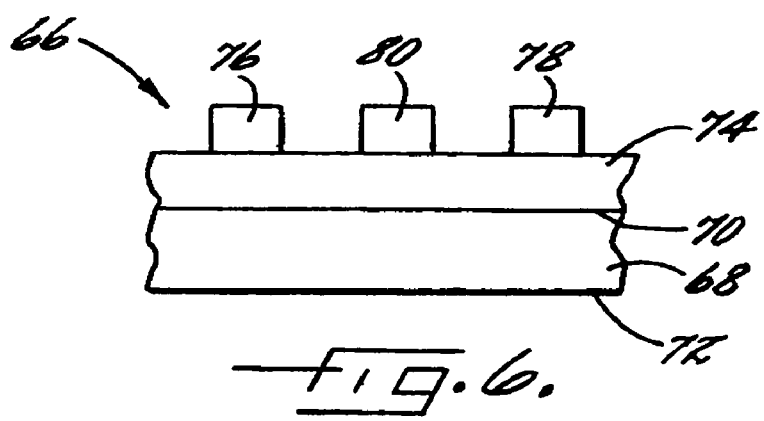
FIG. 6 is a schematic cross-sectional view of a metal semiconductor field effect transistor in accordance with the present invention.

With reference to FIG. 6, in another aspect the invention is a plurality of metal semiconductor field effect transistors (MESFETs) 66 formed on a low defect 3 inch silicon carbide wafer 68 having a warp less than about 0.5 µm, bow less than about 0.5 µm, and a TTV less than about 1.0 µm. The substrate 68 includes a respective first surface 70 and second surface 72 opposite one another. A conductive channel 74 is located on the first surface 70 of the substrate 68. Ohmic source 76 and a drain 78 contacts are located on the conductive channel 74. A metal gate contact 80 is located between the source 76 and drain 78 on the conductive channel 74 for forming an active channel when a bias is applied to the metal gate contact 80.

As is known in the art, more than one type of device may be situated on a silicon carbide wafer in accordance with the present invention. Additional devices that may be included are junction-field effect transistors, heterofield effect transistors, diodes, and other devices known in the art. The structure and operation of these (and other) devices are well-understood in this art and can be practiced using the substrates described and claimed herein without undue experimentation.

EXAMPLES

A series of three-inch diameter and approximately one millimeter thick SiC wafers were formed according to the present invention. The warp, bow and TTV of each of these wafers is shown in Table 1.

TABLE 1

Warp, bow, and TTV of SiC Wafers

| Wafer | Warp (μm) | Bow (μm) | TTV (μm) |
|---|---|---|---|
| 1 | 0.222 | −0.116 | 0.623 |
| 2 | 0.147 | −0.018 | 0.673 |
| 3 | 0.0846 | 0.0267 | 0.739 |

In the specification and the drawings, typical embodiments of the invention have been disclosed. Specific terms have been used only in a generic and descriptive sense, and not for purposes of limitation. The scope of the invention is set forth in the following claims.

The invention claimed is:

1. A high quality single crystal wafer of SiC having a diameter of at least about 3 inches, a warp of less than about 5 μm, a bow of less than about 5 μm and a TTV of less than about 2.0 μm.

2. A SiC crystal according to claim 1 wherein the warp is less than about 2 μm.

3. A SiC crystal according to claim 1 wherein the warp is less than about 1 μm.

4. A SiC crystal according to claim 1 wherein the bow is less than about 2 μm.

5. A SiC crystal according to claim 1 wherein the bow is less than about 1 μm.

6. A SiC crystal according to claim 1 wherein the TTV is less than about 1.5 μm.

7. A SiC crystal according to claim 1 wherein the TTV is less than about 1 μm.

8. A SiC crystal according to claim 1 wherein the crystal has a polytype selected from the group consisting of the 3C, 4H, 6H, 2H, and 15R polytypes.

9. A high quality semiconductor wafer comprising:
a silicon carbide wafer having a diameter of at least about 3 inches;
said wafer having the 4H polytype; and
said wafer having a warp of between about 0.05 μm and about 5 μm, a bow of between about 0.05 μm and about 5 μm, and a TTV of between about 0.5 and 2.0 μm.

10. A high quality semiconductor precursor wafer comprising:
a silicon carbide wafer having a diameter of at least about 3 inches;
said wafer having a warp of less than about 5 μm, a bow of less than about 5 μm, and a TTV of less than about 2.0 μm; and
at least one epitaxial layer on said surface of said silicon carbide wafer selected from the group consisting of Group III-nitrides and silicon carbide.

11. A semiconductor wafer according to claim 10 wherein said Group III-nitride layer is selected from the group consisting of GaN, AlGaN, AlN, AlInGaN, InN, AlInN, and combinations thereof.

12. A semiconductor device precursor structure comprising:
a silicon carbide wafer having a diameter of at least about 3 inches, a warp of less than about 5 μm, a bow of less than about 5 μm, and a TTV of less than about 2.0 μm; and
a plurality of respective Group III-nitride epitaxial layers on some portions of said wafer.

13. A semiconductor wafer comprising:
a bulk single crystal silicon carbide substrate having a diameter of at least about 3 inches, a warp of less than about 5 μm, a bow of less than about 5 μm, and a TTV of less than about 2.0 μm, said bulk single crystal having respective first and second surfaces opposite one another; and
a plurality of devices on said silicon carbide substrate, each said device comprising:
an epitaxial layer located on the substrate, said layer having a concentration of suitable dopant atoms for making the epitaxial layer a first conductivity type, and respective source, channel, and drain portions; a metal oxide layer on said channel portion; and
a metal gate contact on said metal oxide layer for forming an active channel when a bias is applied to said metal gate contact.

14. A semiconductor wafer comprising:
a bulk single crystal silicon carbide substrate having a diameter of at least about 3 inches, a warp of less than about 5 μm, a bow of less than about 5 μm, a TTV of less than about 2.0 μm, said bulk single crystal having respective first and second surfaces opposite one another; and
a plurality of devices on said silicon carbide substrate, each said device comprising:
a conductive channel on said substrate;
a source and a drain on said conductive channel; and
a metal gate contact between said source and said drain on said conductive channel for forming an active channel when a bias is applied to said metal gate contact.

15. A semiconductor wafer comprising:
a bulk single crystal silicon carbide substrate having a diameter of at least about 3 inches, a warp of less than about 5 μm, a bow of less than about 5 μm, and a TTV of less than about 2.0 μm, said bulk single crystal having respective first and second surfaces opposite one another; and
a plurality of junction field-effect transistors positioned on said single crystal silicon carbide substrate.

16. A semiconductor wafer comprising:
a bulk single crystal silicon carbide substrate having a diameter of at least about 3 inches, a warp of less than about 5 μm, a bow of less than about 5 μm, and a TTV of less than about 2.0 μm, said bulk single crystal having respective first and second surfaces opposite one another; and
a plurality of hetero-field effect transistors positioned on said single crystal silicon carbide substrate.

17. A semiconductor wafer comprising:
a bulk single crystal silicon carbide substrate having a diameter of at least about 3 inches, a warp of less than about 5 μm, a bow of less than about 5 μm, and a TTV of less than about 2.0 μm, said bulk single crystal having respective first and second surfaces opposite one another; and
a plurality of diodes positioned on said single crystal silicon carbide substrate.

* * * * *

UNITED STATES PATENT AND TRADEMARK OFFICE
CERTIFICATE OF CORRECTION

PATENT NO. : 7,422,634 B2
APPLICATION NO. : 11/101110
DATED : September 9, 2008
INVENTOR(S) : Adrian Powell et al.

It is certified that error appears in the above-identified patent and that said Letters Patent is hereby corrected as shown below:

In Page 2 under FOREIGN PATENT DOCUMENTS:

DELETE:
WO    WO 90/00717 A1    1/1990

-- and INSERT --

WO    WO 90/00817 A1    1/1990

Signed and Sealed this

Twenty-eighth Day of October, 2008

JON W. DUDAS
*Director of the United States Patent and Trademark Office*